(12) United States Patent
Cuppens

(10) Patent No.: US 6,275,418 B1
(45) Date of Patent: Aug. 14, 2001

(54) CIRCUIT WITH NON-VOLATILE MEMORY AND METHOD OF ERASING THE MEMORY A NUMBER OF BITS AT A TIME

(75) Inventor: Roger Cuppens, Eindhoven (NL)

(73) Assignee: U.S. Philips Corporation, New York, NY (US)

( * ) Notice: Subject to any disclaimer, the term of this patent is extended or adjusted under 35 U.S.C. 154(b) by 0 days.

(21) Appl. No.: 09/656,834

(22) Filed: Sep. 7, 2000

(51) Int. Cl.[7] .................................................. G11C 16/04
(52) U.S. Cl. ............................. 365/185.29; 365/185.24; 365/185.03; 365/218
(58) Field of Search .................. 365/185.29, 185.24, 365/218, 185.03, 189.02

(56) References Cited

U.S. PATENT DOCUMENTS 5,835,415 * 11/1998 Harari .............................. 365/185.29
5,844,842 12/1998 Seki et al. ............................ 365/185

FOREIGN PATENT DOCUMENTS

0572240A2  12/1993 (EP).

* cited by examiner

*Primary Examiner*—David Nelms
*Assistant Examiner*—David Lam
(74) *Attorney, Agent, or Firm*—Steven R. Biren

(57) ABSTRACT

The threshold of a number of storage transistors is shifted in steps. After such a step, a collective current through the main current channels of a number of these storage transistors is sensed. The same gate-source voltage is applied to all these transistors during sensing. The collective current indicates whether the threshold of all transistors has been sufficiently shifted. If not, a further threshold shifting step is applied.

10 Claims, 4 Drawing Sheets

CIRCUIT WITH NON-VOLATILE MEMORY AND METHOD OF ERASING THE MEMORY A NUMBER OF BITS AT A TIME

BACKGROUND OF THE INVENTION

The invention relates to a method of erasing a non-volatile memory a number of bits at a time and to an integrated circuit that comprises a non-volatile memory.

U.S. patent application Ser. No. 5,844,842 discloses a Flash EEPROM device. The memory contains a matrix of memory transistors, organized in columns of transistors that have their main current channel connected in common to a bit-line for the column. Transistors in the same row have their control terminals connected together. In a flash memory information is stored by adjusting the threshold of memory transistors.

A typical memory transistor is a field effect transistor with a floating gate, whose threshold can be adjusted by injecting or removing charge carriers from the floating gate. Initially, the threshold of all memory transistors is at a first level, the erased level, which represents a first logical value. If a different logical value has to be stored at some locations in the memory, the threshold of the transistors that correspond to the relevant memory locations must be shifted. The memory shifts these thresholds to a second level, the programmed level. This is called programming.

In a read operation a transistor is selected from a column and the threshold of the selected transistor is sensed. For this purpose the memory supplies the selected transistor with a gate-source voltage between the programmed and erased level. As a result, the main current channel of the selected transistor will or will not conduct current, depending on whether the threshold of the transistor has or has not been programmed. The other transistors that are connected to the same column are prevented from delivering current to the bit-line. As a result, the logical value stored in the selected transistor can be determined from the current through the bit-line .

After the memory has been programmed with information the memory must be erased before different logical information can be stored. In a flash memory a block of memory transistors, for example a sector consisting of a number of rows of the matrix, is erased as a whole.

As described in the prior art, it is important that the threshold of all memory transistors is shifted back sufficiently to the erased level. To ensure this, the memory performs erasing in repeated steps. In each step threshold shifting signals are applied to all transistors in the sector. After each step the memory reads information successively from the different memory transistors in the sector. The erase steps are repeated until the read-out logic information level in all transistors corresponds to the erased level.

SUMMARY OF THE INVENTION

It is an object of the invention to reduce the time needed for erasing information from the memory.

Claim 1 describes a method of erasing information according to the invention. According to the invention a number of transistors in the same column (preferably all transistors that are part of an erased sector) are read out collectively to determine whether they have been erased properly. This contrasts with the prior art where the transistors in the same column are read out one by one. The determination is performed by selecting more than one transistor in the column at the same time. The resulting collective current through the bitline from all the selected transistors is used to determine a logical read-out value of the memory, which signals whether the current is in a predetermined range or not (preferably the current range corresponding to one of the possible logical states of a single storage transistor in normal use). Dependent on the logical read-out value erasing is repeated or not.

Preferably, the bitlines of several columns are conductively connected to each other. The resulting combined collective current from the se several bitlines is then used to determine the logical read-out value. This is particularly useful in a memory in which normal read-out of programmed data involves connection of a sense amplifier to a selectable one of the bit-lines for a number of columns. In such a memory only one sense amplifier is provided for a number of columns. By connecting the bit-lines for those columns to the sense amplifier collectively, proper erasure of a number of columns can be tested simultaneously with the available sense amplifier.

Preferably, all transistors in a column or a number of columns of the erased sector are selected together to test whether they have been properly erased. In this way the test of an entire sector can be performed in one read operation.

The idea behind the invention is that the collective current provides sufficient information to decide whether an additional erase step is to be performed in any one of the selected transistors. For the purpose of deciding about an erase step it is not necessary to examine currents from individual transistors separately.

In one embodiment, where the threshold voltage is raised during erasing, none of the selected transistors will eventually draw any significant current once the transistors have been sufficiently erased. In case of sufficient erasure, the collective current through a plurality of selected transistors is therefore much less than the current through a single transistor that has not been erased.

If any one of the transistors is insufficiently erased, more current will flow through the bitline. This current can be distinguished from the insignificant current that flows through the bitline after sufficient erasure, preferably using the sensing circuit that is normally used for distinguishing the erased and programmed state of individual transistors. If too much current flows, an additional erase step must be performed.

If more than one of the transistors is insufficiently erased, more current will be drawn, but this should lead to the same response: performing an additional erase step. So for the purpose of deciding about an additional erase step it suffices to determine whether the collective current is larger than a predetermined value.

In another example, the threshold voltage is lowered during erasing. In this case, the transistors will draw current once they are sufficiently erased. Erasing is performed in steps and performance of the steps is stopped before the threshold of any of the transistors is over erased. For this purpose a lower gate source voltage is applied to the transistors collectively than during normal read out of individual transistors.

As long as none of the transistors is over erased, an insignificant current will flow, which is smaller than the current through an individual transistor in the erased state during normal readout. In this case, erasing may be repeated. When at least one of the transistors threatens to become over erased, more current will flow and no additional erase steps will be performed. In case more transistors threaten to become over erased, there is simply more current and no erase needs to be performed either. So for the purpose of deciding about an additional erase step it suffices to determine whether the collective current is smaller than a predetermined value.

BRIEF DESCRIPTION OF THE DRAWING

These and other advantageous aspects of the method and circuit according to the invention will be described by way of non-limitative examples using the following figures.

DESCRIPTION OF THE PREFERRED EMBODIMENTS

Figure 1:
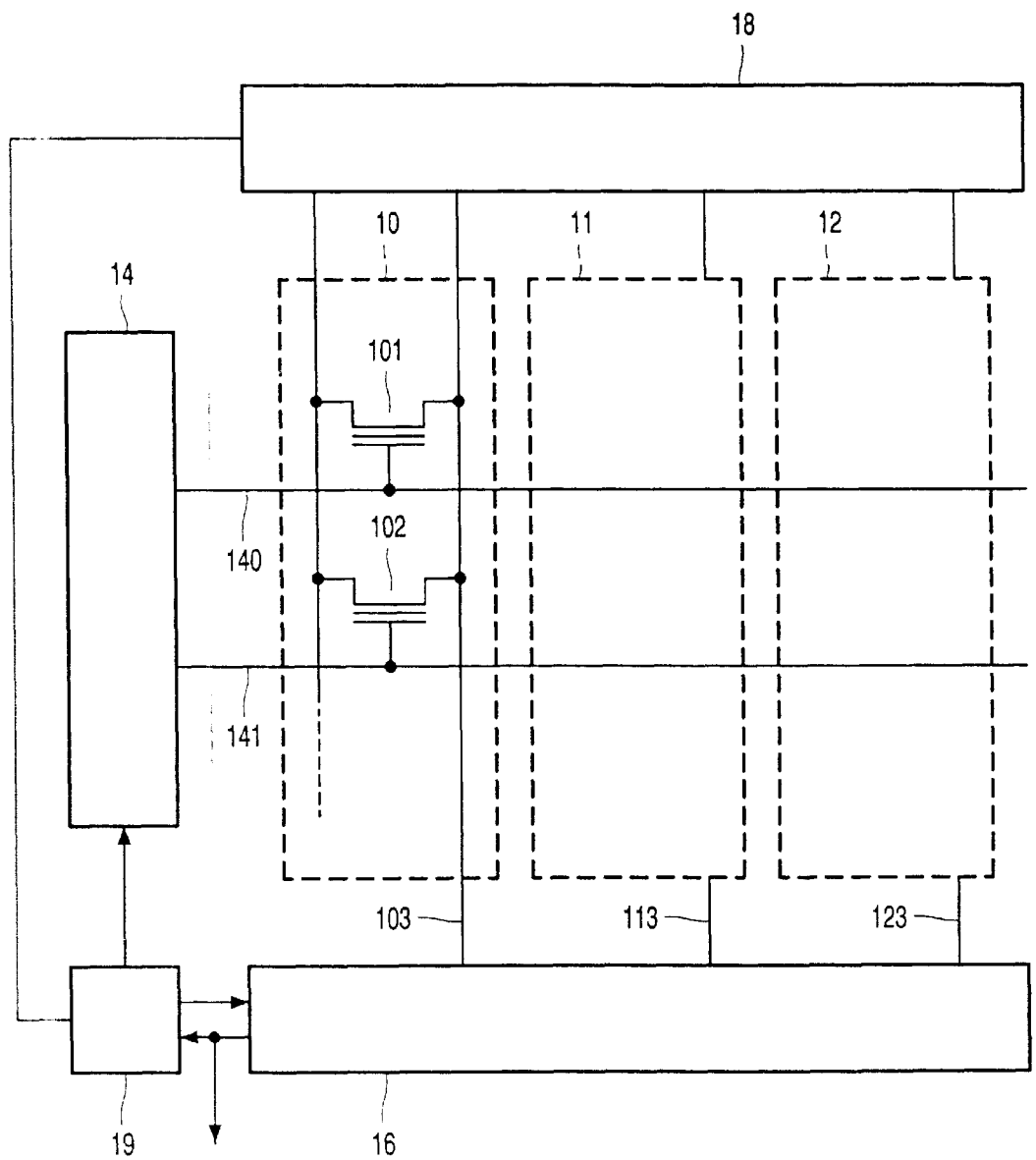
FIG. 1 shows a circuit with a memory

FIG. 1 shows a circuit with a memory. The circuit contains a memory matrix with a number of memory columns 10, 11, 12, a word line decoder 14, a number of word lines 140, 141, a bit-line sense circuit 16, a source/drain voltage supply circuit 18, and a control circuit 19.

Each column 10, 11, 12 contains a bitline 103, 113, 123.and a number of floating-gate memory transistors 101, 102, each with a floating gate. (Only two memory transistors are shown in one of the columns 10, but more transistors, e.g. 256 or 4096 transistors will normally be present in each column 10, 11, 12). The drains of the memory transistors 101, 102 of each column 10, 11, 12 are connected collectively to the bitline 103, 113, 123 of the column. The bit-lines 103, 113, 123 and the sources of the memory transistors are connected to the source/drain voltage supply circuit 18.

The word-line decoder 14 has outputs, each coupled to a respective one of the wordlines 140, 141, each wordline 140, 141 in turn is connected to the gates of the memory transistors 101, 102 in a respective row of the memory matrix, that is, to the gate of one memory transistor 101, 102 in each column 10, 11, 12. The bit-lines 103, 113, 123 ofthe columns 10, 11, 12 are connected to the bit-line sense circuit 16, which in turn has outputs coupled to the control circuit 19.

Figure 6:
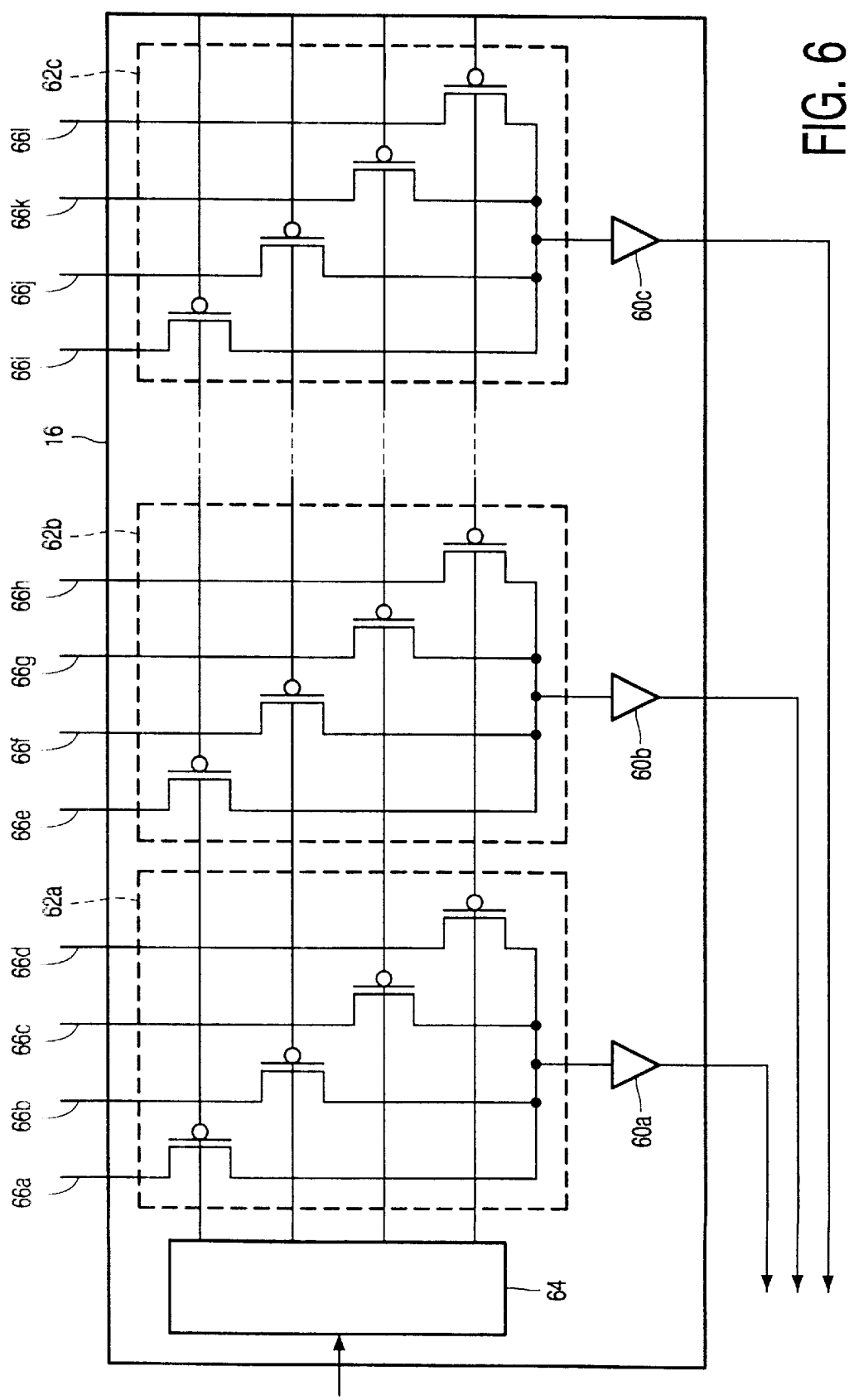
FIG. 6 shows a bit-line sense circuit.

FIG. 6 shows an embodiment of a bit line sense circuit, which contains or a respective sense amplifier 60a–b each time for a group of bitlines 66a–h. The sense amplifiers 60a–b are connected to the bitlines 66a–h via a multiplex circuits 62a–b for connecting selectable ones of the bitlines 66a–h to the sense amplifiers 60a–b. A bit line selection control circuit 64 is coupled to the multiplex circuits 62a,b to control connection of bitlines 66a–h to the sense amplifiers 60a–b. By way of example, a bit line sense circuit with groups of four bit lines 60a–h is shown, each group having its bitlines 66a–h connected to a respective one of the sense amplifiers. Of course, larger or smaller groups may be used, e.g. of 32 bit lines. In an alternative embodiment (not shown) the bit line sense circuit 16 contains a respective sense amplifier (not shown) for each bit-line.

The control circuit 19 (which is implemented for example as a programmed microcontroller) has outputs coupled to the word line decoder 14 and the source/drain voltage supply circuit. During normal read operations of the memory (reading transistors individually) the outputs of the bitline sense circuit 16 may be used to supply read-out information for normal processing. For this purpose the outputs of the bit-line sense circuit 16 may also be connected to further circuits (not shown), for example a main processor or a peripheral device.

In operation, information is represented in the memory transistors 101, 102 by charge stored on a floating gate. Various methods of reading information and of injecting or removing charge from the floating gates are known per se to the skilled person. Depending on the method used, the skilled person will select an appropriate implementation of the wordline decoder 14 and the source/drain voltage supply circuit 18. By way of illustration a simple method of reading will be shown herein.

Figure 2:
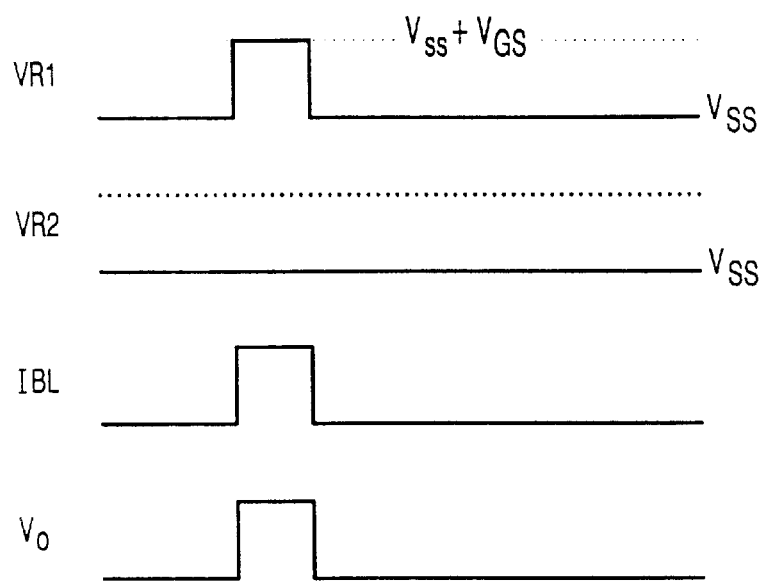
FIG. 2 shows signals used to read from the memory

FIG. 2 shows time dependent signals used in a simple example of a method to read information. During reading, the source/drain voltage supply circuit 18 keeps the sources of the memory transistors 101, 102 at ground (Vss) level. The bitlines 103, 113, 123 are isolated from one another. The word line decoder 14 receives a row address, which selects one row of memory transistors 101, 102. In response the word line decoder 14 applies a voltage Vss+VGS to the word line 140, 141 for the selected row. The wordlines 140, 141 for the other rows (only one other row in the simplified example of FIG. 1) receive Vss. The resulting gate source voltages of the memory transistors in the different rows are shown as VR1, VR2 in FIG. 2.

VGS is selected so that each transistor in the selected row will conduct or not, depending on whether its threshold has been adjusted to a programmed or erased level. As a result, the memory transistors will conduct current dependent on whether the threshold of the selected transistor connected to the bitline has been adjusted to the programmed level or the erased level. The resulting current is shown as IBL in FIG. 2.

The bitline sense circuit 16 senses whether current is drawn from the bitlines 103, 113, 123. In case of a bit line sense circuit 16 with groups of bit lines (as shown in FIG. 6) the bit line sense circuit receives a selection signal, for selecting one bit-line 66a–h from each group. The bit-line selection control circuit 64 receives the selection signal and decodes it to activate conduction paths through the multiplex circuits 62a,b from the selected bit line 66a–h in each group to the sense amplifier 60a,b for the group. The bitline sense circuit 16 outputs signals indicating whether that current is above a predetermined level or not. The resulting logic output for one bitline is shown as VO in FIG. 2.

Information is written into the memory transistors 101, 102 by adjusting their thresholds. In an example, two threshold levels are used: an erased level and a programmed level. The levels represent two different logical values respectively.

Initially (after erasing) all memory transistors 101, 102 have such a charge at their floating gate that they all have their threshold substantially at the same level, called the "erased level". Information is written under control of the control circuit 19. When information is written, the threshold of individually selected memory transistors 101, 102 is adjusted to the programmed level (e.g. lowered), by changing the amount of charge on the floating gate of a selected transistor. Methods for doing so are known per se to the skilled person and use for example Fowler Nordheim tunneling or hot electron injection.

To overwrite information, the memory first has to be erased. This is done by adjusting the thresholds of all memory transistors 101, 102 in a sector. A sector contains a number of rows in all columns 10, 11, 12, The thresholds of all rows and columns in the sector are erased to the erased level collectively (e.g. raising their threshold).

The source/drain supply circuit 18 and the wordline decoder effect erasing by applying suitable combinations of voltages to the source, drain and gate of the memory transistors 101, 102. Erasing uses for example Fowler Nordheim tunneling and the voltage combinations to effect this process is known per se to the skilled person.

Figure 3:
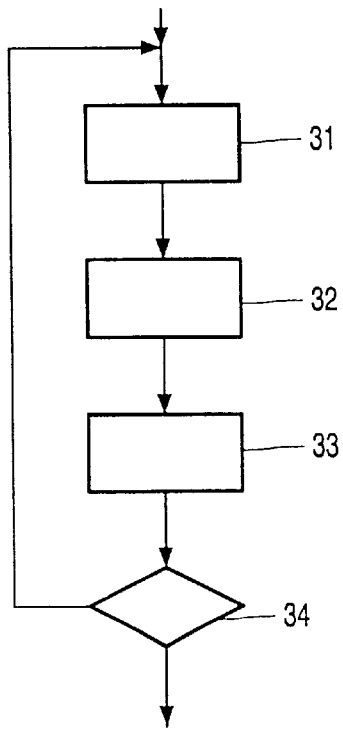
FIG. 3 shows a flow chart describing an erase operation

The control circuit 19 controls erasing in repeated cycles. FIG. 3 shows a flow chart of performing erasing. In a first step 31, the control circuit commands the source/drain supply circuit 18 and the wordline decoder 14 to apply suitable combinations of voltages to the memory transistors 101, 102 to shift their threshold to the erased level.

In a second step 32, the control circuit 19 commands the source/drain supply circuit 18, the wordline decoder 14 and the bitline sense circuit 16 to sense the thresholds of the memory transistors 101, 102.

In a third step 33, the control circuit 19 reads out the logical read out result for a column from the bitline sense circuit 16. This logical read out result represents whether the threshold of any of the memory transistors in the column has not yet been shifted sufficiently towards the erased level.

In a fourth step 33, the control circuit 19 checks whether the threshold of any of the memory transistors has not yet been shifted sufficiently towards the erased level. If so, the steps are repeated from the first step 31. If not, erasing is finished.

Figure 4:
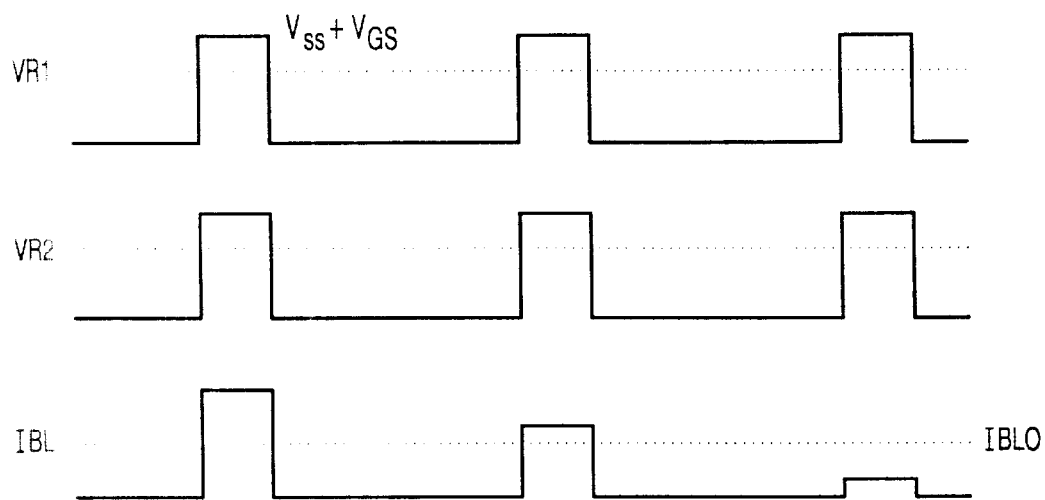
FIG. 4 shows signals used to verify erasing of the memory

FIG. 4 shows voltages used in repeated executions of the second step 32. By way of illustration, the case is shown where erasing corresponds to raising the threshold of the memory transistors 101, 102. Basically, the voltages shown correspond to a repeated read-out operations as shown in FIG. 2, with the exception that the voltages VR1, VR2 of more than one wordline 140, 142 are brought to a level VGS collectively.

Similarly, in case of the bit line sense circuit of FIG. 6, the bit line selection control circuit 64 is directed to activate conduction paths through the multiplex circuit 62 from all bit-lines 66a–h of each group to the sense amplifier for the group. Preferably, the transistors in all rows that have been erased (such a plurality of rows is called a sector) receive VGS and all bit-lines in a group are sensed. But without deviating from the invention, fewer rows or fewer bit-lines may be connected together, as long as two or more memory transistor are allowed to conduct current to the same sense amplifier.

As a result, more than one of the memory transistors 101, 102 of each column 10, 11, 12 are selected at the same time and more than one such memory transistor can draw current from the bitline 103, 113, 123 for a column 10, 11, 12 at the same time. The resulting current IBL to the sense amplifier initially may be higher than the bitline current IBL0 drawn by a single programmed transistor (shown as a dashed line).

The gate-source voltage VGS applied during the second step 32 is higher than the gate-source voltage VGS0 (whose level is shown as a dashed line VGS0) applied during normal read out. VGS is substantially at the lower edge of a range of threshold levels that includes the erased level and an acceptable spread around that level. Hence, any memory transistor 101, 102 whose threshold is not yet raised to the erased level will draw current from the bitline 103, 113, 123 to which it is connected. All such transistors in the same column will draw a combined current from the bitline 103, 113, 123 of the column 10, 11, 12. This combined current will decrease in successive executions of the second step 32 until it drops below a predetermined level when it is certain that the threshold of all memory transistors 101, 102 in the sector has at least reached the erased level.

The bitline sense circuit 16 senses the combined current IBL from all selected memory transistors 101, 102. The bitline sense circuit 16 outputs a logical signal V0 that represents whether the collective current has fallen below a predetermined maximum erased current. Thus, the logical signal V0 represents whether the threshold of any one of the selected transistors 101, 102 has not yet been shifted sufficiently towards the erased level.

Of course, the implementation shown using the figures is but an example of an embodiment the invention. Numerous different embodiments are possible.

For example, the invention does not depend on the precise way of adjusting the thresholds of the memory transistors. Configurations for applying threshold-shifting signals that differ from the configuration used in FIG. 2 may be used. Different connections for reading may be used, sharing bitlines between different columns, using differential sense amplifiers and reference memory transistors etc.

As another example of different implementations, the control circuit 19 can be implemented as a special purpose unit, for example as a state machine that controls reading, program and erasing. Alternatively, the control circuit can be implemented as a programmed microcontroller. In this case the microcontroller may contain other programs that use the memory as data or instruction memory. In addition the microcontroller controls erasing of the memory. In yet another alternative, the control circuit can be implemented as dedicated hardware, for example using an erase flip-flop and an erase/readout toggle circuit. In this case the erase flip-flop, when set, enables the erase/readout toggle circuit. The erase/toggle circuit makes the memory alternately perform an erase operation and a readout operation to verify the erase operation. An output of the bit line sense circuit 16 is connected to a reset input of the erase flip-flop, so that the flip-flop is reset once the logic output of the bitline sense circuit 16 indicates that the threshold of all relevant memory transistors has been adjusted sufficiently. It will be clear that there are many alternative implementations of the control circuit. The control circuit, however implemented, may be integrated with the memory on a single semiconductor chip, or it may be part of a system distributed over different chips.

As another example, although FIG. 1 shows that the same bitline sense circuit 16 is used both for read out and for verification of erasing, one may of course use different circuits, or adjust the bit line sense circuit 16 to switch from one logic output level to another at different current levels during read out and during verification.

As a further example, instead of a single memory transistor 101, 102, one may use a floating gate transistor and a normal transistor with their main current channels in series with each other. In this case the gate of normal transistor may be connected to the word line to select the floating gate transistor, whereas the gate of the floating gate transistor is connected to a reference voltage supply, which discriminates between the programmed and the erased level, but which does not perform the selection.

As yet another example, erasing may correspond to lowering the threshold voltage (so that an erased memory transistor 101, 102 conducts during normal readout) instead of to raising the threshold voltage as shown in FIG. 4 (where an erased memory transistor 101, 102 does not conduct during normal readout). In the former case the thresholds of the memory transistors 101, 102 are lowered collectively during erasing. Lowering is performed in successive steps. After each step it is verified whether the thresholds have been sufficiently lowered.

Figure 5:
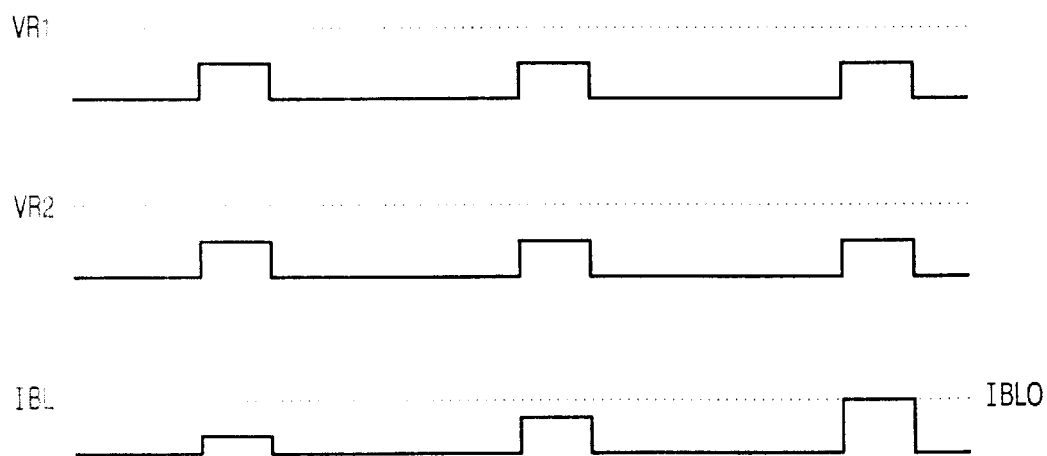
FIG. 5 shows further signals used to verify erasing of the memory

FIG. 5 illustrates this verification. Verification is done by applying the same gate source voltage to all memory transistors 101, 102, using the wordline voltages VR1, VR2. This same gate source voltage is lower than the gate-source voltage during normal read-out. The resulting bitline current IBL rises after erase step. Erasing is stopped once the bit line sense circuit 16 outputs an output signal Vo that indicates that the sensed current (the combined current drawn by the memory transistors 101, 102 from the bitline 103, 113, 123) exceeds a predetermined current. In this case it may be assumed that the thresholds have been lowered sufficiently because a current flows through at least one of the memory transistors when a low gate-source voltage is applied. In this way it is prevented that the threshold voltage is lowered too much.

Of course PMOS floating gate transistors may be used instead of NMOS floating gate transistors, which results in an exchange of the roles of low and high voltages.

What is claimed is:

1. A method of erasing a non-volatile memory, the memory comprising a matrix of storage transistors and a sense circuit provided at least for a set of the storage transistors, each storage transistor having an adjustable threshold, different threshold values representing an erased and programmed state respectively, wherein the method of erasing comprises the steps of
    shifting the threshold of at least two of said storage transistors in said set towards threshold values that represent the erased state;
    sensing a current through the main current channel of the storage transistors in said set after said shifting;
    repeating said shifting and sensing until the current has entered a predetermined current range;
    said sensing comprising sensing a combined current drawn through the sense circuit in parallel by the main current channels of a plurality of the storage transistors from said set whose threshold has been shifted, while applying substantially a same gate-source voltage to said plurality of the storage transistors.

2. A method according to claim 1, the set comprising a plurality of storage transistors arranged in a column of the matrix, the memory comprising a bitline connected to the main current channel of each of the storage transistors in the column, said sensing comprising sensing a combined current drawn through the bitline by the main current channels of the plurality of the storage transistors whose threshold has been shifted.

3. A method according to claim 1, the memory comprising a respective bit line for each column of the matrix, the set comprising storage transistors arranged in a row of the matrix, the main current channel of each of the transistors in the set being coupled to a respective one of the bit-lines in a subset of the bit-lines, the bitlines in said subset, collectively, being conductively coupled to the sense circuit for said sensing.

4. A method according to claim 1, wherein the main current channels of the storage transistors are relatively less and more conductive when the thresholds represent the erased and programmed state respectively, said predetermined current range being a range wherein the combined current is less than a predetermined current.

5. A circuit comprising a non-volatile memory with
    a memory matrix with columns of storage transistors, each storage transistor having an adjustable threshold voltage, different threshold voltage values representing an erased and programmed state respectively;
    a sense circuit;
    a selection circuit coupled to the transistors for allowing selectable ones from a set of the of the storage transistors to conduct current to the sense circuit while receiving a gate-source voltage between the erased and programmed threshold value;
    an erase circuit for applying threshold shifting signals at least to the set of storage transistors;
    an erase control circuit arranged for
        activating the erase circuit during a limited time-interval at least for the set of the storage transistors,
        subsequently controlling the selection circuit to select simultaneously a plurality of the storage transistors whose threshold has been shifted, and to apply a same gate-source voltage to said plurality of storage transistors, so that a combined current from the storage transistors of the plurality in parallel is conducted to the sense circuit;
        reading the sense circuit to obtain information about the combined current;
        repeating said activating, controlling and reading until the collective current is in a predetermined current range.

6. A circuit according to claim 5, the memory comprising a bitline connected to main current channels of each of the storage transistors in a column of the matrix, the main current channels of the storage transistors from the plurality being connected to the bitline, the combined current comprising a current through the bitline.

7. A circuit according to claim 5, the memory comprising a respective bit line for each column of the matrix, the main current channel of the storage transistors in the row each being coupled to a respective one of the bit-lines, the selection circuit comprising a multiplexing circuit connected between a subset of the bitline and the sense circuit, the plurality comprising storage transistors arranged in the row, the selection circuit conductively coupling the subset of the bitlines simultaneously to the sense circuit for said reading.

8. A circuit according to claim 5, wherein the storage transistors having main current channels that conduct the combined current, the main current channels of the storage transistors being relatively less and more conductive when the thresholds represent the erased and programmed state respectively, said predetermined current range being a range wherein the combined current is less than a predetermined current.

9. A circuit according to claim 8, the sense circuit being used for sensing whether individually selectable ones of the plurality of storage transistors are in the erased or programmed state during normal reading from the memory.

10. A circuit according to claim 5, wherein the storage transistors having main current channels that conduct the combined current, the main current channels of the storage transistors are relatively more and less conductive, when the thresholds are on the erased level and the programmed level respectively, said predetermined current range being a range wherein the combined current is more than a predetermined current.

* * * * *